(12) United States Patent
Umeda

(10) Patent No.: US 7,924,120 B2
(45) Date of Patent: Apr. 12, 2011

(54) PIEZOELECTRIC RESONATOR AND PIEZOELECTRIC FILTER HAVING A HEAT-RADIATING FILM

(75) Inventor: Keiichi Umeda, Nonoishi-machi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 63 days.

(21) Appl. No.: 12/495,889

(22) Filed: Jul. 1, 2009

(65) Prior Publication Data

US 2009/0261922 A1    Oct. 22, 2009

Related U.S. Application Data

(63) Continuation of application No. PCT/JP2007/070662, filed on Oct. 23, 2007.

(30) Foreign Application Priority Data

Jan. 24, 2007  (JP) .................................. 2007-013846

(51) Int. Cl.
*H03H 9/08*    (2006.01)
*H03H 9/15*    (2006.01)
*H03H 9/54*    (2006.01)

(52) U.S. Cl. ......... 333/187; 310/341; 310/346; 333/189
(58) Field of Classification Search .................. 333/133, 333/187–189; 310/322, 324, 346, 341
See application file for complete search history.

(56) References Cited

U.S. PATENT DOCUMENTS

| | | | |
|---|---|---|---|
| 6,051,907 A | 4/2000 | Ylilammi | |
| 6,396,200 B2* | 5/2002 | Misu et al. | 310/348 |
| 6,906,451 B2 | 6/2005 | Yamada et al. | |
| 7,474,174 B2* | 1/2009 | Milsom et al. | 333/189 |
| 2001/0054941 A1 | 12/2001 | Shibata et al. | |
| 2003/0107456 A1 | 6/2003 | Nishihara et al. | |
| 2004/0056735 A1 | 3/2004 | Nomura et al. | |
| 2004/0263026 A1* | 12/2004 | Wang | 310/341 |

(Continued)

FOREIGN PATENT DOCUMENTS

JP    07-260660 A    10/1995

(Continued)

OTHER PUBLICATIONS

English language machine translation of JP 2003-168953, published Jun. 13, 2003.*

(Continued)

*Primary Examiner* — Barbara Summons
(74) *Attorney, Agent, or Firm* — Keating & Bennett, LLP

(57) ABSTRACT

A piezoelectric resonator includes a substrate and a thin-film section. The thin-film section includes a first thin-film section supported by the substrate, and an acoustically-isolated second thin-film section which is separated from the substrate. In the second thin-film section, first and second electrodes are arranged on the respective main surfaces of a piezoelectric film, and a vibration section is provided at an area where the first and the second electrodes overlap each other on the second thin-film section when viewed through in the film-thickness direction. The thin-film section further includes a heat-radiating film which is in contact with peripheral edges of at least the first electrode among the first and second electrodes defining portions of a periphery of the vibration section, and which extends from the peripheral edges to the first thin-film section when viewed through in the film-thickness direction.

15 Claims, 13 Drawing Sheets

U.S. PATENT DOCUMENTS

2006/0131990 A1* 6/2006 Milsom et al. .................. 310/311
2007/0152775 A1 7/2007 Fujii et al.
2007/0278899 A1* 12/2007 Fujii ............................. 310/324

FOREIGN PATENT DOCUMENTS

| | | | |
|---|---|---|---|
| JP | 2001-502136 A | | 2/2001 |
| JP | 2002-237738 A | | 8/2002 |
| JP | 2003-168953 | * | 6/2003 |
| JP | 2003-204239 A | | 7/2003 |
| JP | 2004-120219 A | | 4/2004 |
| JP | 2004-221622 A | | 8/2004 |
| JP | 2007-243361 | * | 9/2007 |
| WO | 2006/027873 A1 | | 3/2006 |
| WO | WO 2006/087878 | * | 8/2006 |

OTHER PUBLICATIONS

Official Communication issued in International Patent Application No. PCT/JP2007/070662, mailed on Jan. 15, 2008.

* cited by examiner

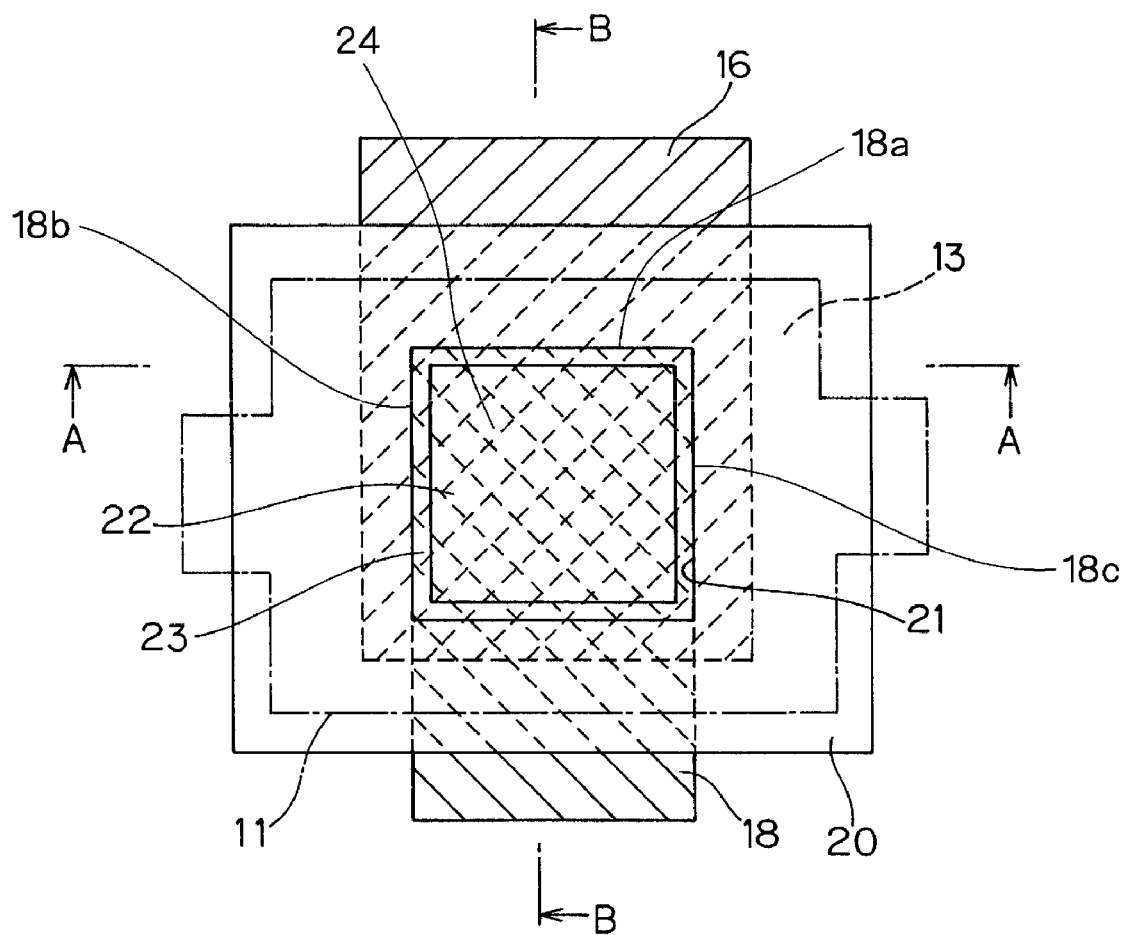

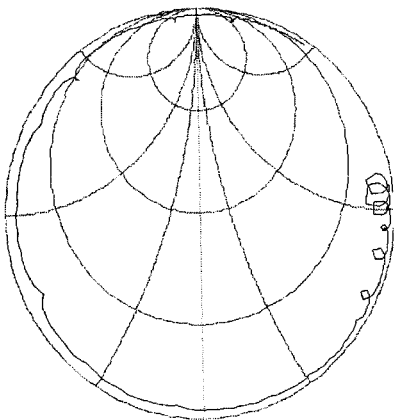
FIG. 3A 0 nm
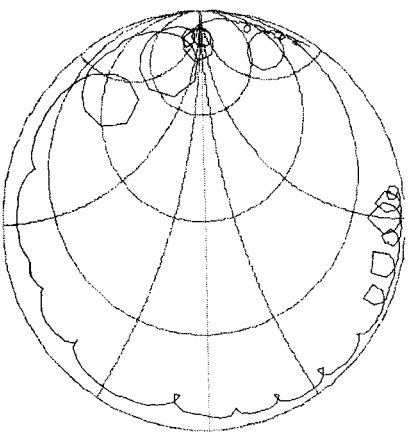
FIG. 3B 500 nm
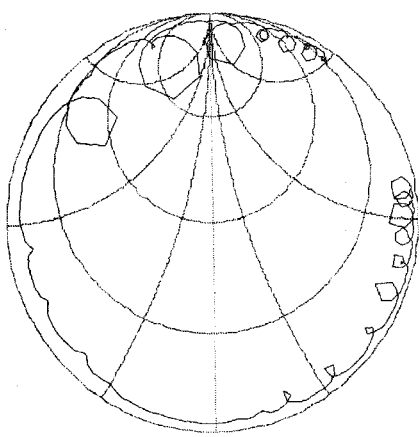
FIG. 3C 660 nm
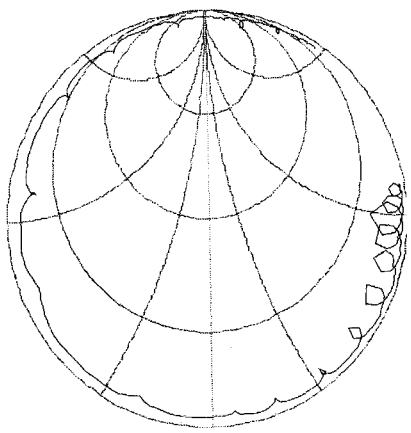
FIG. 3D 680 nm
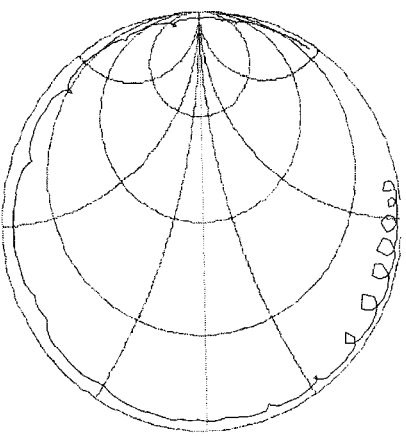
FIG. 3E 700 nm
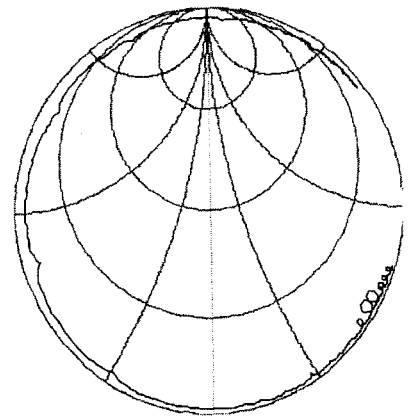
FIG. 3F 750 nm FIG. 4A 1.0 W
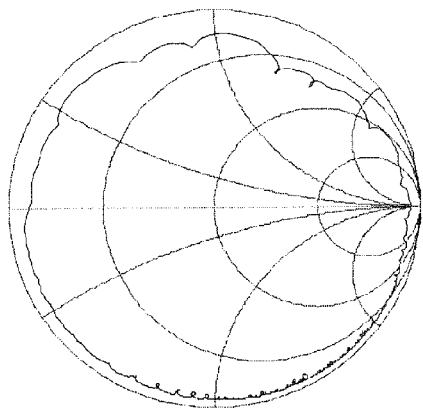
FIG. 4B 3.4 W
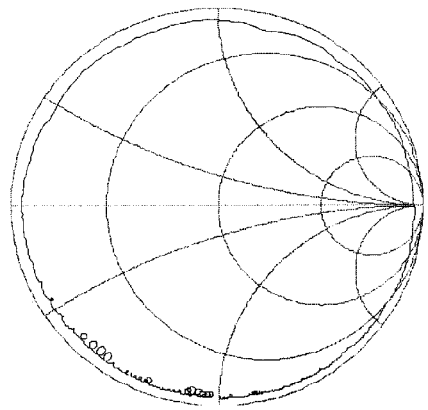
FIG. 5
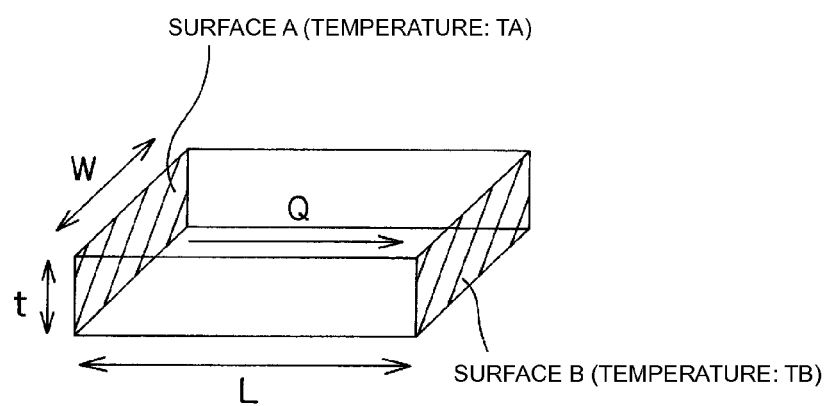

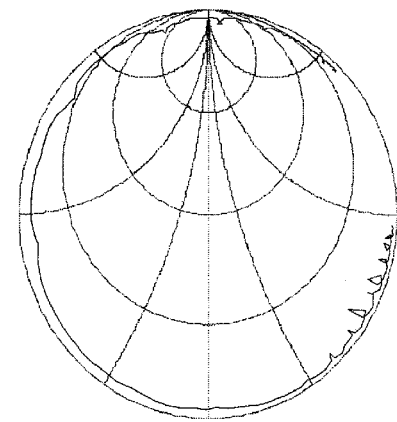
FIG. 8C 880 nm
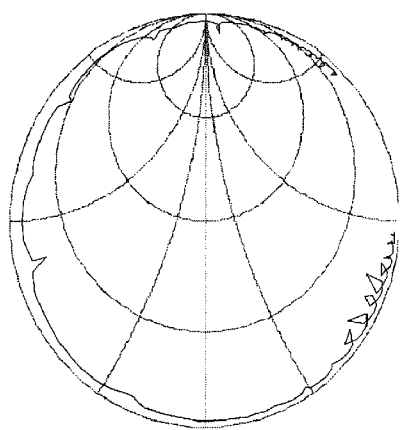
FIG. 8F 950 nm
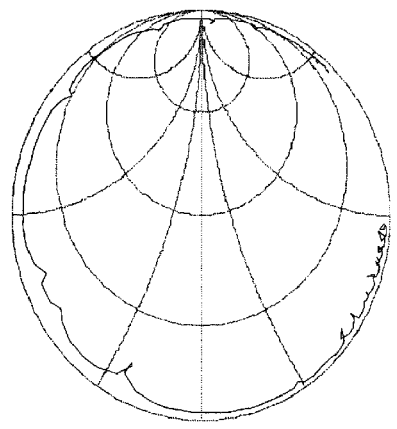
FIG. 8B 860 nm
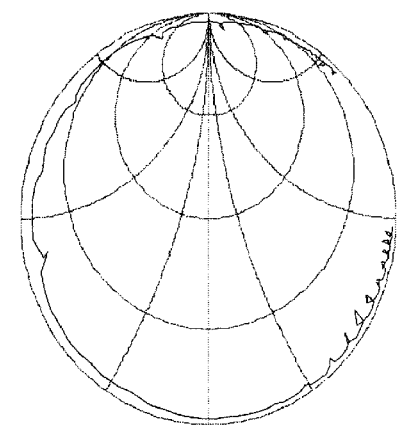
FIG. 8E 920 nm
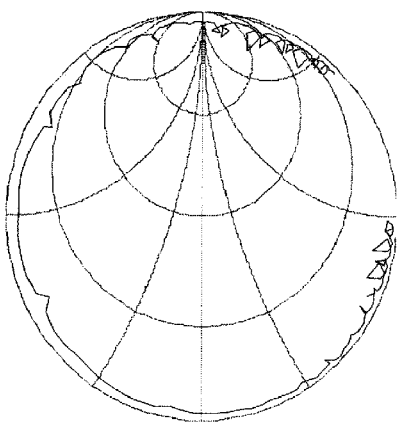
FIG. 8A 0 nm
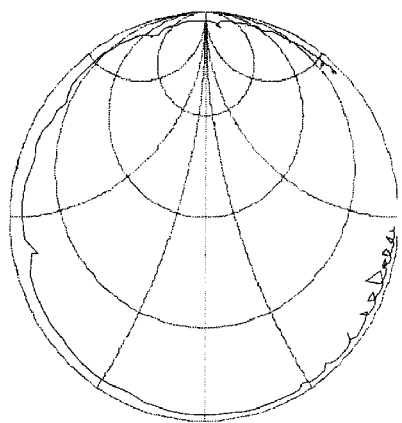
FIG. 8D 900 nm

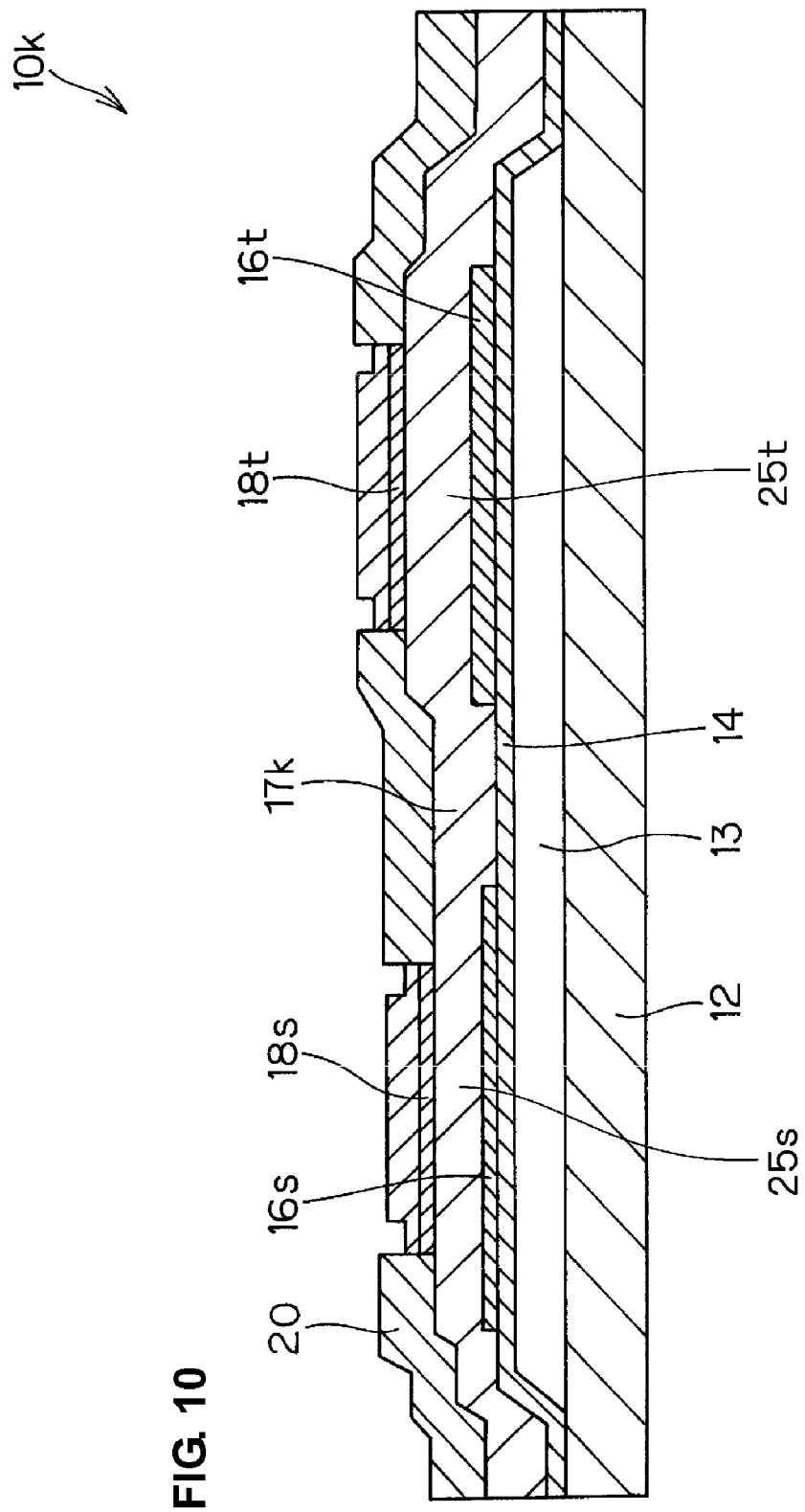

PIEZOELECTRIC RESONATOR AND PIEZOELECTRIC FILTER HAVING A HEAT-RADIATING FILM

BACKGROUND OF THE INVENTION

1. Field of the Invention

The present invention relates to a piezoelectric resonator and a piezoelectric filter.

2. Description of the Related Art

In general, a piezoelectric resonator is configured such that a thin-film portion in which a piezoelectric film is sandwiched between an upper electrode and a lower electrode is arranged on a substrate, and a vibration section in which the upper and lower electrodes overlap with each other is acoustically isolated from the substrate. Heat is generated in the vibration section.

For example, Japanese Unexamined Patent Application Publication No. 2004-120219, as shown in FIG. 17 which is a plan view and FIG. 18 which is a sectional view taken along a line A to A of FIG. 17, discloses a technique of improving a heat-radiating property and an electric-power resistance by forming a heat-radiating film 118 in a portion, except for a vibration portion 111b, of a piezoelectric resonator having a substrate subjected to through-etching from a back surface thereof so that a space 110a is formed. That is, a lower electrode 114 which has a substantially cross shape in a plan view and which includes a base portion 114a, a tip portion 114b, and wing portions 114c, a piezoelectric thin-film 115, an upper electrode which has a projecting shape in a plan view and which includes a base portion 116a and a tip portion 116b which have different widths, and the heat-radiating film 118 are arranged on an $SiO_2$ film 111 which is formed on a first main surface of the substrate 110. The vibration portion 111b corresponds to a portion in which the tip portion 114b of the lower electrode 114 and the tip portion 116b of the upper electrode 116 overlap each other (i.e., a hatched portion in FIG. 17). Note that a $Si_2$ film 112 arranged on a second main surface of the substrate 110 is removed in a step of manufacturing.

However, since the upper electrode 116 is exposed in an opening 118a provided in the heat-radiating film 118 with a gap between the heat-radiating film 118 and the exposed upper electrode 116, and the heat-radiating film 118 is arranged so as to be isolated from the vibration section 111b which defines a heat-generation source, heat conduction is degraded due to the gap between the vibration section 111b and the heat-radiating film 118, which results in a degraded heat-radiating property. Furthermore, deterioration of a Q factor occurs due to unnecessary vibration in the piezoelectric resonator, and the deterioration of the Q factor causes heat generation. Therefore, in order to improve electric-power resistance, the heat-radiating property is improved and the unnecessary vibration is prevented from occurring so that the heat generation due to the deterioration of the Q factor is prevented.

SUMMARY OF THE INVENTION

To overcome the problems described above, preferred embodiments of the present invention provide a piezoelectric resonator and a piezoelectric filter with an improved heat-radiating property and which prevents heat generation caused by unnecessary vibration.

A piezoelectric resonator according to a preferred embodiment of the present invention includes a substrate and a thin-film section. The thin-film section includes a first thin-film section that is supported by the substrate and a second thin-film section that is acoustically isolated from the substrate. The second thin-film section includes a piezoelectric thin film in which first and second electrodes are disposed on respective main surfaces thereof, so that a vibration section is provided in a portion in which the first and second electrodes overlap each other in the second thin-film section when viewed through in a film-thickness direction. The thin-film section further includes a heat-radiating film which is in contact with a peripheral edge of at least one of the first and second electrodes defining portions of a periphery of the vibration section, and which extends from the peripheral edge of the at least one of the first and second electrodes to the first thin-film section when viewed through in the film-thickness direction.

With the configuration described above, a portion of heat that is generated in the vibration section included in the second thin-film section is transmitted from one of the first and second electrodes, which are in contact with the heat-radiating film, through the heat-radiating film to the first thin-film section. Therefore, a heat-radiating path is enlarged, and the heat generated in the vibration section is effectively radiated to the substrate. Accordingly, a piezoelectric resonator having excellent electric-power resistance is obtained.

Furthermore, since the heat-radiating film is arranged so as to surround the vibration section, unnecessary vibration is prevented from being generated in a surrounding region of the heat-radiating film. Accordingly, spurious responses are effectively suppressed, and heat generation caused by a degraded Q factor is suppressed. Consequently, a piezoelectric resonator having excellent electric-power resistance is obtained.

Moreover, since a thickness of the thin-film section can be increased by adding the heat-radiating film while a film configuration of the vibration section which achieves a desired resonant frequency is maintained, the mechanical strength of the membrane configuration in which the second thin-film section is isolated from the substrate is improved.

Note that when the electrode is in contact with the peripheral edge of only one of the first and second electrodes, when the electrode is in contact with the peripheral edge of the one of the first and second electrodes which defines the majority of the periphery of the vibration section, heat is more effectively radiated.

A piezoelectric resonator according to a preferred embodiment of the present invention includes a substrate and a thin-film section. The thin-film section includes a first thin-film section supported by the substrate and a second thin-film section acoustically isolated from the substrate. The second thin-film section includes a piezoelectric thin film in which first and second electrodes are disposed on respective main surfaces thereof so that a vibration section is defined in a portion in which the first and second electrodes overlap each other in the second thin-film section when viewed through in a film-thickness direction. The thin-film section further includes a heat-radiating film which overlaps with a peripheral edge of at least one of the first and second electrodes defining portions of a periphery of the vibration section, and which extends from a portion inside the vibration section relative to the periphery of the vibration section to the first thin-film section when viewed through in the film-thickness direction.

With the configuration described above, a portion of heat that is generated in the vibration section included in the second thin-film section is transmitted from one of the first and second electrodes, with which the heat-radiating film overlaps, through the heat-radiating film to the first thin-film section. Therefore, a heat-radiating path is enlarged, and the heat that is generated in the vibration section is effectively radiated to the substrate. Accordingly, a piezoelectric resonator having excellent electric-power resistance is obtained.

Furthermore, since the heat-radiating film is arranged so as to surround the vibration section, unnecessary vibration is prevented from being generated in a surrounding region of the heat-radiating film. Accordingly, a spurious response is effectively suppressed, and heat generation caused by a degraded Q factor is suppressed. Consequently, a piezoelectric resonator having excellent electric-power resistance is obtained.

Moreover, since a thickness of the thin-film section can be increased by adding the heat-radiating film while a film configuration of the vibration section which achieves a desired resonant frequency is maintained, the mechanical strength of a membrane configuration in which the second thin-film section is isolated from the substrate is improved.

Note that when the electrode overlaps the peripheral edge of only one of the first and second electrodes, when the electrode overlaps the peripheral edge of the one of the first and second electrodes which defines the majority of the periphery of the vibration section, heat is more effectively radiated.

In the vicinity of a peripheral edge of the heat-radiating film arranged towards the inside relative to the periphery of the vibration section when viewed through in a film-thickness direction, thicknesses of portions of the heat-radiating film preferably increase as the portions are farther from the periphery edge.

In this case, when a portion corresponding to the peripheral edge of the heat-radiating film is configured so as to have a tapered shape in cross section, a range of allowable displacement of the peripheral edge of the heat-radiating film which is located inside the periphery of the vibration section is increased, and accordingly, mass production of products having excellent manufacturing yields is achieved.

The piezoelectric thin-film section preferably includes a step-forming film having a step portion with an interval between the step portion and the periphery of the vibration section when viewed through in the film-thickness direction.

In this case, since the step portion is provided in the step-forming film with the interval between the step portion and the periphery of the vibration section, a spurious response lower than a resonant frequency is effectively suppressed. Accordingly, a piezoelectric resonator with reduced loss is obtained.

A film thickness of the first electrode included in the vibration section and a film thickness of the second electrode included in the vibration section are preferably different from each other.

In this case, piezoelectric resonators having different frequencies for a filter are obtained with increased precision, for example.

More preferably, the film thickness of the first electrode included in the vibration section is relatively small and the film thickness of the second electrode included in the vibration section is relatively large.

In this case, a spurious response is efficiently suppressed for all of the piezoelectric resonators having different frequencies included in the filter, for example.

A piezoelectric filter according to a preferred embodiment of the present invention includes a plurality of piezoelectric resonators each corresponding to one of the piezoelectric resonators described above on a single substrate, which include respective vibration sections. The first and second electrodes which define the vibration sections are electrically connected to each other so as to define a filter circuit.

In this case, a ripple is effectively suppressed, and heat generation caused by an increase of loss is effectively suppressed. Accordingly, a piezoelectric filter having excellent electric-power resistance is obtained. Furthermore, a heat-radiating path is enlarged, and the heat generated in the vibration section is effectively radiated to the substrate.

Each of the vibration sections preferably has a substantially square shape or a substantially rectangular shape having a ratio of a long side to a short side of about 2 or less, for example, when viewed through in the film-thickness direction.

In this case, since vibration sections are arranged with high density, an unnecessary region is eliminated and can be omitted. Accordingly, an overall area of the filter is reduced.

Each of the plurality of vibration sections preferably has a substantially square shape or a substantially rectangular shape having approximately a golden ratio of a long side to a short side when viewed through in the film-thickness direction.

In this case, since vibration sections are arranged with high density, an unnecessary region is omitted. Accordingly, an overall area of the filter is reduced.

Use of the piezoelectric resonator and the piezoelectric filter according to preferred embodiments of the present invention improves the heat-radiating property and prevents heat from being generated due to unnecessary vibration.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 1 is a plan view illustrating a piezoelectric resonator according to a first preferred embodiment of the present invention.

FIGS. 3A to 3F are Smith charts of the piezoelectric resonator according to the first preferred embodiment of the present invention.

FIGS. 4A and 4B are Smith charts of the piezoelectric resonator according to the first preferred embodiment of the present invention.

FIG. 5 is a model chart illustrating heat transfer.

FIGS. 8A to 8F are Smith charts of a piezoelectric resonator according to a second preferred embodiment of the present invention.

FIG. 10 is a sectional view illustrating a piezoelectric filter according to a fourth preferred embodiment of the present invention.

DETAILED DESCRIPTION OF PREFERRED EMBODIMENTS

Preferred embodiments of the present invention will be described with reference to FIGS. 1 to 16.

First Preferred Embodiment

A piezoelectric resonator 10 according to a first preferred embodiment of the present invention will be described with reference to FIGS. 1 to 5.

Figure 2A:
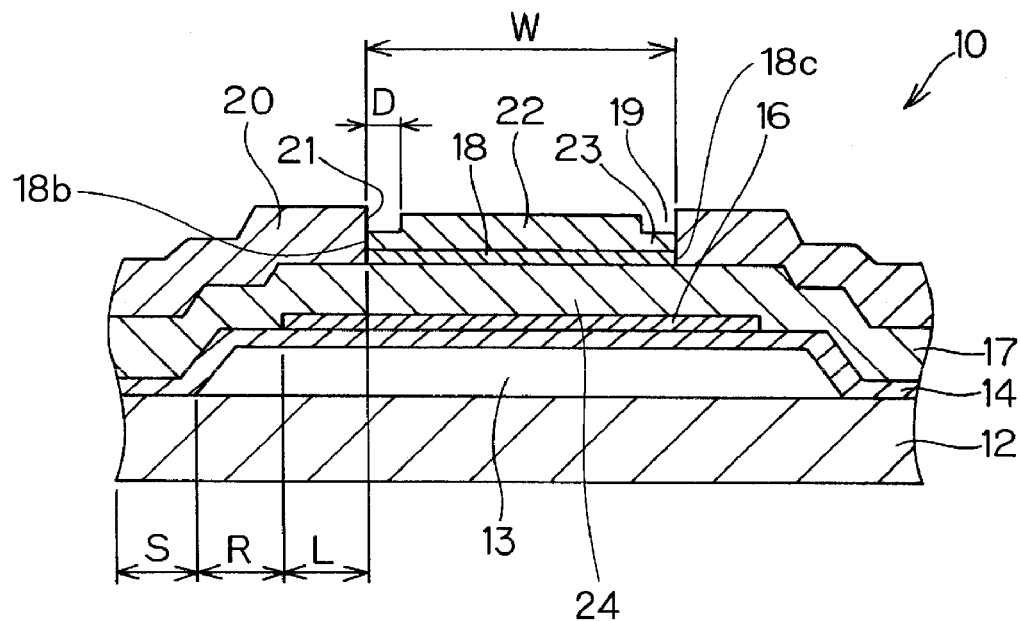
FIGS. 2A and 2B are sectional views illustrating the piezoelectric resonator according to the first preferred embodiment of the present invention.
Figure 2B:
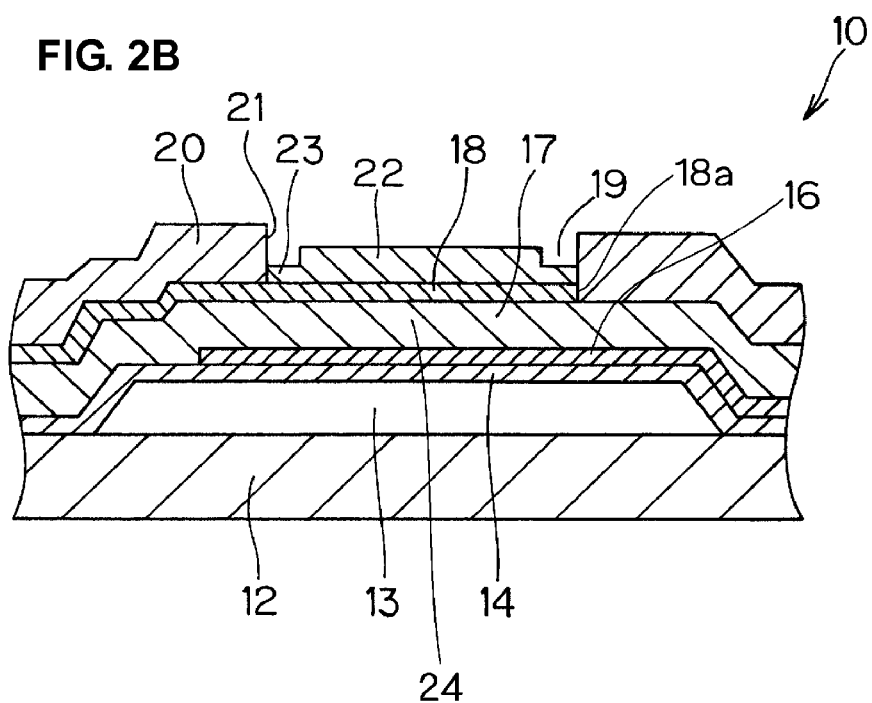

As schematically shown in FIG. 1 which is a plan view, FIG. 2A which is a sectional view taken along a line A to A of FIG. 1, and FIG. 2B which is a sectional view taken along a line B to B, a thin-film section is provided on a substrate 12 of the piezoelectric resonator 10. That is, a supporting film 14, a lower electrode 16, a piezoelectric film 17, an upper electrode 18, a heat-radiating film 20, and a step-forming film 22 are laminated on the substrate 12 in that order. In FIG. 1, the lower electrode 16 and the upper electrode 18 are indicated by hatching, and portions of the lower electrode 16 and the upper electrode 18 which are hidden by other films which overlap thereon are indicated by a dashed hatching.

The thin-film section includes a first thin-film section (denoted by a reference character S in FIG. 2A) supported by the substrate 12 and a second thin-film section (denoted by reference characters R, L, and W in FIG. 2A) which is isolated from the substrate 12 with a gap 13 interposed therebetween. In the second thin-film section, a vibration section (denoted by the reference character W in FIG. 2A) which is arranged such that a piezoelectric film 17 is interposed between the lower electrode 16 and the upper electrode 18 is provided. The gap 13 is configured such that a sacrificial film 11 is arranged on the substrate 12 as indicated by a dashed line in FIG. 1, the lower electrode 16, for example, is further provided on the sacrificial film 11, and thereafter, the sacrificial film 11 is removed.

The vibration section 24 is provided at a portion in which the lower electrode 16 and the upper electrode 18 which are denoted by the hatching in FIG. 1 overlap each other when viewed through in a film-thickness direction (i.e., in a vertical direction relative to the paper of FIG. 1, and in a vertical direction of the drawing in FIGS. 2A and 2B).

As shown in FIG. 1, a width of the lower electrode 16 is preferably greater than that of the upper electrode 18 in and in the vicinity of the vibration section 24. As indicated by the reference character L in FIG. 2A, when viewed through in the film-thickness direction, an additional-film region corresponds to a portion of the lower electrode 16, which protrudes outward from the vibration section corresponding to the reference character W. The additional-film region traps vibration in the vibration section by a mass addition operation.

The heat-radiating film 20 includes an opening 21 as shown in FIG. 1. The opening 21 of the heat-radiating film 20 is in contact with a periphery of the vibration section 24 when viewed from the film-thickness direction. As shown in FIGS. 2A and 2B, the heat-radiating film 20 extends from the periphery of the vibration section 24 to the first thin-film section. As shown in FIG. 1 and FIGS. 2A and 2B, the heat-radiating film 20 is preferably in contact with peripheral edges 18a, 18b, and 18c of the upper electrode 18 which correspond to portions (three sides) of the periphery of the vibration section 24.

The heat-radiating film 20 should preferably be in contact with at least a portion of the vibration section 24 when viewed through in the film-thickness direction. A configuration in which the heat-radiating film 20 is in contact with three sides, two side, or only one side of the periphery of the vibration section 24 of a substantially rectangular shape may preferably be used, for example, instead of the configuration shown in FIG. 1 in which the heat-radiating film 20 is in contact with four sides of the periphery of the substantially rectangular vibration section 24 when viewed through in the film-thickness direction. Alternatively, the heat-radiating film 20 may preferably be in contact with only a portion of a certain side of the periphery of the vibration section 24, or may preferably be partially in contact with the periphery of the vibration section 24 (that is, the heat-radiating film 20 partially has portions which are not in contact with the vibration unit 24).

The step-forming film 22 is arranged inside the opening 21 of the heat-radiating film 20. A resonant frequency of the vibration section 24 is controlled by changing a thickness of the step-forming film 22. The step-forming film 22 is preferably formed by, for example, etching performed on an entire wafer after a device is manufactured, etching performed on a portion of a wafer after partial masking is performed, or etching performed for individual devices, and is used for frequency control.

A thickness of a periphery-vicinity portion 23 of the step-forming film 22 is preferably less than other portions of the step-forming film 22. A step 19 is provided along the opening 21 of the heat-radiating film 20. The step 19 reduces a spurious response in a frequency region substantially equal to or less than the resonant frequency.

Note that the supporting film 14 and the step-forming film 22 may be omitted.

An example of a method for manufacturing the piezoelectric resonator 10 will now be described.

The sacrificial film 11 preferably made of ZnO, for example, is arranged on the substrate 12 so as to form a gap. The ZnO sacrificial film 11 is formed by an appropriate method, such as wet etching, for example.

Then, the supporting film 14 which preferably has a thickness of about 100 nm, for example, and which is preferably made of a $SiO_2$ film, for example, is formed so as to cover the ZnO sacrificial film 11. Thereafter, a laminated metal film which preferably has a thickness of about 10 nm, for example, and which is preferably made of Ti, for example, a laminated metal film which preferably has a thickness of about 30 nm, for example, and which is preferably made of Pt, for example, a laminated metal film which preferably has a thickness of about 60 nm, for example, and which is preferably made of Au, for example, a laminated metal film which preferably has a thickness of about 10 nm, for example, and which is preferably made of Pt, for example, and a laminated metal film which preferably has a thickness of about 10 nm and which is preferably made of Ti, for example, are formed in this order on the supporting film 14 by sputtering. Then, a resultant object is patterned by a photolithography method so that the lower electrode 16 is formed.

Next, the piezoelectric film 17 preferably made of AlN, for example, is formed by sputtering so as to cover the lower electrode 16 and so as to preferably have a thickness of about 1580 nm, for example. Thereafter, patterning is performed so that a portion of the lower electrode 16 is exposed.

Then, a laminated metal film which preferably has a thickness of about 10 nm, for example, and which is preferably made of Ti, for example, a laminated metal film which preferably has a thickness of about 10 nm, for example, and which is preferably made of Pt, for example, a laminated metal film which preferably has a thickness of about 60 nm, for example, and which is preferably made of Au, for example, a laminated metal film which preferably has a thickness of about 30 nm, for example, and which is preferably made of Pt, for example, and a laminated metal film which preferably has a thickness of about 10 nm, for example, and which is preferably made of Ti, for example, are formed in this order on the piezoelectric film 17 by sputtering, and a resultant object is patterned by the photolithography method so that the upper electrode 18 is formed.

Thereafter, the heat-radiating film 20 preferably made of AlN, for example, is formed from a periphery of the upper electrode 18 to the first thin-film portion so as to have a thickness of 680 nm, for example, and patterning is performed so that the opening 21 is formed and the upper electrode 18 is exposed.

Then, the step-forming film 22 preferably made of a SiO$_2$ film, for example, is arranged on an entire or substantially an entire upper surface of the upper electrode 18 which is exposed from the opening 21 of the heat-radiating film 20 so as to preferably have a thickness of about 100 nm, for example.

Next, an upper surface of the step-forming film 22 is subjected to dry etching so that a portion along the periphery of the step-forming film 22 (that is, a portion along the opening 21 of the heat-radiating film 20) is removed. By this process, the step 19 is formed in the step-forming film 22 along the periphery of the step-forming film 22. Note that the dry etching is performed so that a thickness of the periphery-vicinity portion 23 of the step-forming film 22 is reduced by about 20 nm, for example.

After the piezoelectric film 17 of AlN is formed, a surface of the piezoelectric film 17 may preferably be subjected to etching by an ICP (Inductively Coupled Plasma) etching device using an Ar plasma and subjected to flattening processing. Alternatively, a thin piezoelectric film may preferably be formed, and the flattening processing may be performed on a surface of the thin piezoelectric film. Thereafter, a thick piezoelectric film may preferably be formed, and the flattening processing may be performed on a surface of the thick piezoelectric film. As described above, by flattening the piezoelectric film 17, the crystallinity of the piezoelectric film 17 is improved, and the piezoelectric resonator having excellent electric-power resistance is obtained. Note that a noble gas such as He, Ne, Kr, Xe, or Rn or gas cluster may preferably be used instead of Ar, for example.

A film thickness, a resonant frequency, and an area for a capacitance of about 1 pF in the example of the method for manufacturing of the piezoelectric resonator 10 are shown in Table 1 below.

TABLE 1

Film Configuration of Resonator, Resonant Frequency, and Area for 1 pF

|  | Film Thickness (nm) |
|---|---|
| Step Forming Film SiO$_2$ | 100 nm |
| Amount of Step Etching | 20 nm |
| Heat-Radiating Film AlN | 680 |
| Upper Electrode (Ti/Pt/Au/Pt/Ti) | 10/10/60/30/10 |
| Piezoelectric Film AlN | 1580 |
| Lower Electrode (Ti/Pt/Au/Pt/Ti) | 10/30/60/10/10 |
| Supporting Film SiO$_2$ | 100 |
| Resonant Frequency (MHz) | 1880 |
| Area for Capacitance of 1 pH ($\mu m^2$) | 18000 |

In the example of the manufacturing method, when a width D (refer to FIG. 2A) of a step region which corresponds to the periphery-vicinity portion 23 of the step-forming film 22 is within a range from about 5 µm to about 25 µm, for example, a spurious response caused by a Lamb wave is suppressed. Furthermore, when an amount of etching for forming the step 19 is within a range of about 20 nm±5 nm (a center value±25%), for example, the spurious response caused by the Lamb wave can be suppressed. Moreover, when a width L (refer to FIG. 2A) corresponding to the additional-film region of the lower electrode 16 is substantially equal to or greater than about 10 µm, for example, the spurious response caused by the Lamb wave is suppressed.

The spurious response changes in accordance with the film thickness of the heat-radiating film 20. A change of a spurious characteristic when the thickness of the heat-radiating film AlN is gradually increased from 0 nm (that is, the heat-radiating film 20 is not formed) will be shown in Smith charts of FIGS. 3A to 3F. As shown in FIGS. 3C, 3D and 3E, when the thickness of the heat-radiating film AlN is in a range from about 660 nm to about 700 nm, for example, the spurious response is suppressed. However, as shown in FIGS. 3A, 3B, and 3F, when the thickness of the heat-radiating film AlN is in a range other than the range from about 660 nm to about 700 nm, the spurious response is frequently generated. Unnecessary vibration is trapped in the vibration section and is scattered in peripheral portions of the electrodes, resulting in a deterioration of the Q factor. Meanwhile, energy of the unnecessary vibration is converted into heat energy resulting in heat generation.

Accordingly, when the thickness of the heat-radiating film 20 is within a range of about 680±20 nm (a enter value±3%), for example, the spurious response caused by the Lamb wave is suppressed.

Next, an example of the deterioration of electric-power resistance caused by the deterioration of the Q factor is shown in FIGS. 4A and 4B.

A test of the electric-power resistance is performed on resonators having resonant characteristics as shown in Smith charts of FIGS. 4A and 4B. As a result of the test, breakdown powers of devices of the resonators are about 1.0 W and about 3.4 W, and temperatures of the devices of the resonators are both about 200° C. That is, it is apparent that, as shown in FIG. 4A, in the piezoelectric resonator in which the spurious response is frequently generated, the device has a high heat value even when a low electric power is supplied, and has a low electric-power resistance. On the other hand, it is apparent from the test that, in the piezoelectric resonator in which the spurious response is suppressed as shown in FIG. 4B, excellent electric-power resistance is obtained.

Note that the test of electric-power resistance described herein is a test (step-up test) in which electric power to be supplied to a piezoelectric resonator is gradually increased in accordance with a frequency shift caused by heat generation, that is, electric power to be supplied is stepped up.

By additionally arranging the heat-radiating film 20, the spurious response is suppressed, and heat generation due to a degraded Q factor is suppressed.

Furthermore, since the step 19 is formed along the periphery of the step-forming film 22, the spurious response in a frequency region substantially equal to or less than the resonant frequency is suppressed, and accordingly, heat generation due to a degraded Q factor is suppressed.

Moreover, a portion of heat generated in the vibration section is transmitted from the upper electrode 18 through the step-forming film 22 which is in contact with the upper electrode 18 to the first thin-film section. Therefore, a heat-radiating path is enlarged, and heat generated in the vibration section is effectively radiated to a supporting section.

Next, the enlargement of the heat-radiating path and effective radiation of heat generated in the vibration section to the supporting unit will be described.

In general, a heat value Q transmitted from a surface A to a surface B shown in FIG. 5 is represented by the following Equation (1):

$$Q = \lambda \cdot W \cdot t \cdot (T_A - T_B)/L \quad (1)$$

wherein,
$\lambda$ denotes a heat conductivity,
W denotes a width of a heat-transfer path in cross section,
t denotes a thickness of the heat-transfer path in cross section,
$T_A$ denotes a temperature of the surface A,
$T_B$ denote a temperature of the surface B, and
L denotes a length of the heat-transfer path.

An inverse number 1/R of thermal resistance R denotes an index representing a level of the heat-radiating property, and as the value 1/R is increased, the level the heat-radiating property is also increased. Using the values $\lambda$, W, t, and L of Equation (1), the value 1/R is represented by Equation (2) below:

$$1/R = \lambda \cdot W \cdot t/L \quad (2)$$

According to Expression (2), as the values $\lambda$, W, and t increase, and the value L is reduced, the level of the heat-radiating property is increased.

That is, in the related art disclosed in Japanese Unexamined Patent Application Publication No. 2004-120219, the heat generated in the vibration section is transmitted to a wiring unit which is defined by a metal film having a thickness of about 100 nm to about 200 nm and which has a relatively low heat conductivity and a portion of the piezoelectric film disposed outside the vibration section, and thereafter, transmitted through a region in which the heat-radiating film is provided to the supporting unit. Then, the heat is radiated through an Si substrate which is a good heat conductor, for example.

On the other hand, in the configuration of the first preferred embodiment according to the present invention, since the heat-radiating film is in contact with the vibration section, the heat generated in the vibration section is directly transmitted to the region corresponding to the heat-radiating film. Thereafter, the heat reaches the supporting unit, and is radiated through the Si substrate which is the good heat conductor. Accordingly, the heat-radiating efficiency is dramatically improved when compared to that in the related art.

When material included in the configuration of the piezoelectric resonator 10 is used for the heat-radiating film 20, it is not necessary to prepare another material. Therefore, the cost of a device is reduced. Heat conductivities of various material members used in the piezoelectric resonator are shown in Table 2.

TABLE 2

Various Material Members and Heat Conductivities

| Material | Form | Heat Conductivity (W/mK) |
|---|---|---|
| AlN | C-axis alignment thin film | 50 |
| AlN | non-alignment thin film | 25 |
| ZnO | C-axis alignment thin film | 5 |
| SiO$_2$ | amorphous thin film | 1 |
| Diamond | polycrystal/single-crystal thin film | 900-2000 |
| DLC (Diamond-Like-Carbon) | polycrystal thin film | 40 |
| Pt | polycrystal | 70 |
| Au | polycrystal | 320 |
| Cu | polycrystal | 390 |
| Si | single-crystal bulk | 150 |

According to Table 2, it is apparent that AlN having a large heat conductivity is preferable for the insulating material used for the heat-radiating film. Furthermore, diamond or DLC may be used for the heat-radiating film, and ALN, diamond, or DLC may be used for the supporting film, for example.

A diamond thin film is preferably formed by a micro-wave plasma method, a thermal filament method, a high-frequency plasma method, or a combustion flame method, for example. A DLC thin film is preferably formed by a CVD (chemical vapor deposition) method, such as a plasma CVD method in particular, a PVC (physical vapor deposition) method, a sputtering method, or an ion plating method, for example.

Note that conductive material may be used for the heat-radiating film. However, when the conductive material is arranged so as to cover the entire or substantially the entire periphery of the vibration section, the configuration is complicated in order to prevent the conductive material from being short circuited with conductive lines. Therefore, the conductive material may be used around only a portion of the periphery of the vibration section, and in addition, unnecessary parasitic capacitance may be generated or electromagnetic interference, for example, may occur. Accordingly, an insulating film is preferably used for the heat-radiating film 20.

In the piezoelectric resonator 10 of the first preferred embodiment, thicknesses of portions other than the vibration section in the second thin-film section are increased by adding the heat-radiating film 20 having the opening 21 for the vibration section, while a desired resonant frequency is obtained. By this, the strength of a membrane configuration in which the second thin-film section is isolated from the substrate is improved.

First Modification

Figure 6:
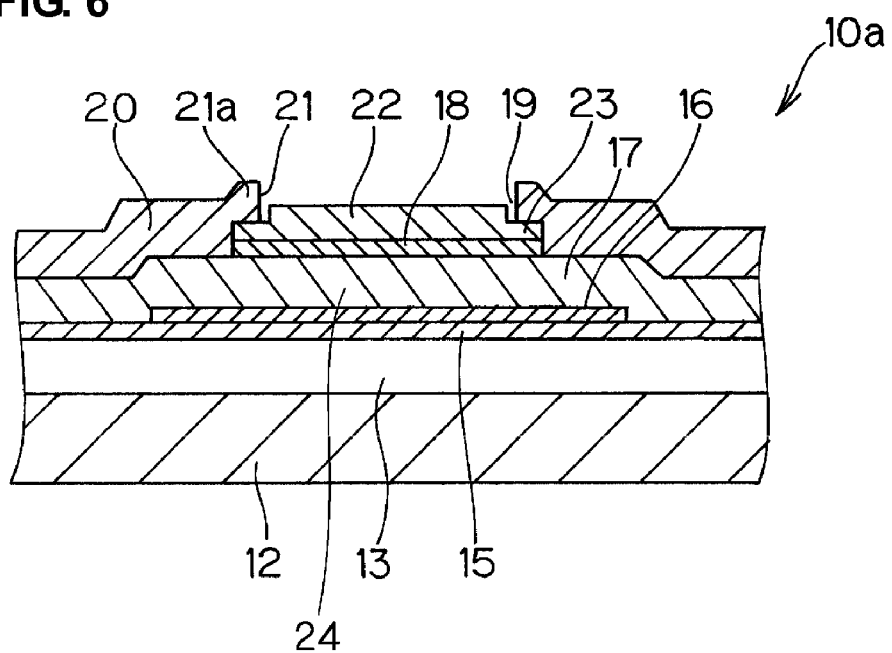
FIG. 6 is a sectional view illustrating a piezoelectric resonator according to a first modification of the first preferred embodiment of the present invention.

As shown in FIG. 6 which is a sectional view of a piezoelectric resonator 10a, a portion 21a of the heat-radiating film 20 may preferably overlap at least a portion of the vibration section. In this case, the heat-radiating film 20 covers at least a portion of the vibration section.

Second Modification

Figure 7:
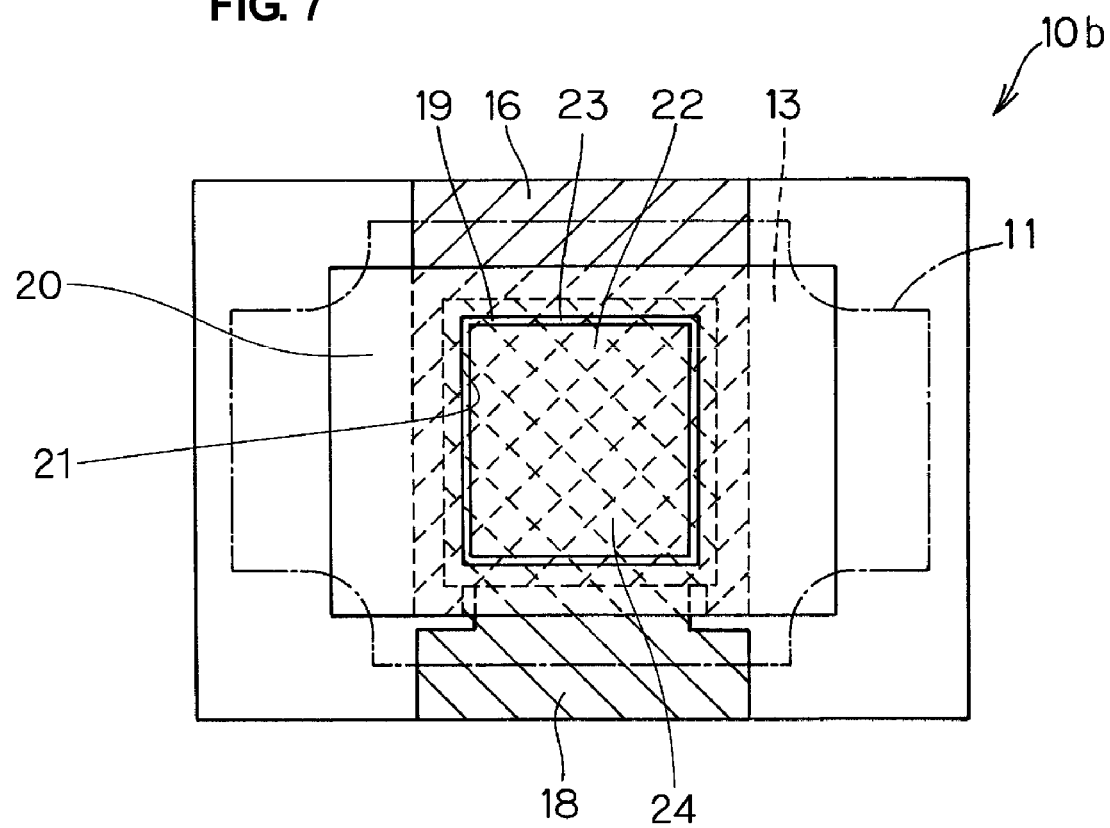
FIG. 7 is a plan view illustrating a piezoelectric resonator according to a second modification of the first preferred embodiment of the present invention.

As shown in FIG. 7 which is a plan view of a piezoelectric resonator 10b, the heat-radiating film 20 may preferably extend only in a direction (in a lateral direction of the drawing) in which portions except for extending-line portions of the lower electrode 16 and the upper electrode 18 extend but not extend in a direction in which the extending-line portions extend (in a vertical direction of the drawing).

Second Preferred Embodiment

A configuration of a second preferred embodiment of the present invention is substantially the same as that of the first preferred embodiment. Hereinafter, components that are the same as or similar to those of the first preferred embodiment are denoted by the same reference numerals as those used in the first preferred embodiment, and a difference from the first preferred embodiment will primarily be described.

As shown in Table 3 which is different from Table 1 of the first preferred embodiment, a piezoelectric resonator of the second preferred embodiment is different from that of the first preferred embodiment in a film configuration.

TABLE 3

Film Configuration of Resonator, Resonant Frequency, and Area for 1 pF

|  | Film Thickness (nm) |
| --- | --- |
| Step Forming Film $SiO_2$ | 100 nm |
| Amount of Step Etching | 20 nm |
| Heat-Radiating Film AlN | 900 |
| Upper Electrode (Ti/Pt/Au/Pt/Ti) | 10/10/80/70/10 |
| Piezoelectric Film AlN | 1135 |
| Lower Electrode (Ti/Pt/Au/Pt/Ti) | 10/70/80/10/10 |
| Supporting Film $SiO_2$ | 100 |
| Resonant Frequency | 1880 |
| Area for Capacitance of 1 pH ($\mu m^2$) | 13000 |

Smith charts of FIGS. 8A to 8F represent resonant characteristics when only a thickness of a heat-radiating film AlN is changed. As shown in FIGS. 8C and 8D, the heat-radiating film AlN prevents generation of a spurious response due to a Lamb wave when the thickness of the heat-radiating film AlN is within a range of about 900 nm±20 nm (a center value±2.3%), for example.

When Table 3 is compared to Table 1, a required area for arranging a resonator having a capacitance of about 1 pF in a configuration of the second preferred embodiment is reduced by about 27% from the area of the configuration of the first preferred embodiment. Therefore, the second preferred embodiment achieves miniaturization of the device. Furthermore, since only a small area is required for a vibration section, a distance through which heat generated in the approximate center of the vibration section is transmitted to a heat-radiating film unit is reduced. Accordingly, an excellent heat-radiating property and an excellent electric-power resistance are obtained.

Third Preferred Embodiment

A piezoelectric resonator according to a third preferred embodiment of the present invention will be described with reference to FIGS. 9A to 9C which are sectional views.

A configuration of the piezoelectric resonator of the third preferred embodiment is the substantially same as that of the first preferred embodiment except that a taper is provided in the vicinity of an end portion of a heat-radiating film which is in contact with the vibration section or an end portion of the heat-radiating film which overlaps the vibration portion. A step-forming film and a supporting film are not shown in FIG. 9. However, the step-forming film and the supporting film may preferably be provided.

Figure 9A:
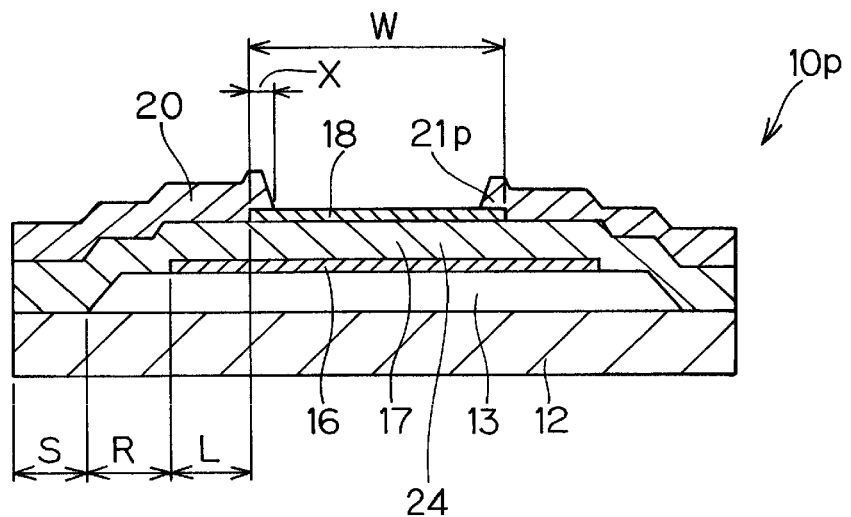
FIGS. 9A to 9C are sectional views illustrating a piezoelectric resonator according to a third preferred embodiment of the present invention.

In a piezoelectric resonator 10p shown in FIG. 9A, an end portion 21p having a tapered shape in cross section which is included in a heat-radiating film 20 overlaps an upper electrode 18 so that the heat-radiating film 20 overlaps a portion inside a periphery of the vibration section when transparently viewed from a film-thickness direction.

Figure 9B:
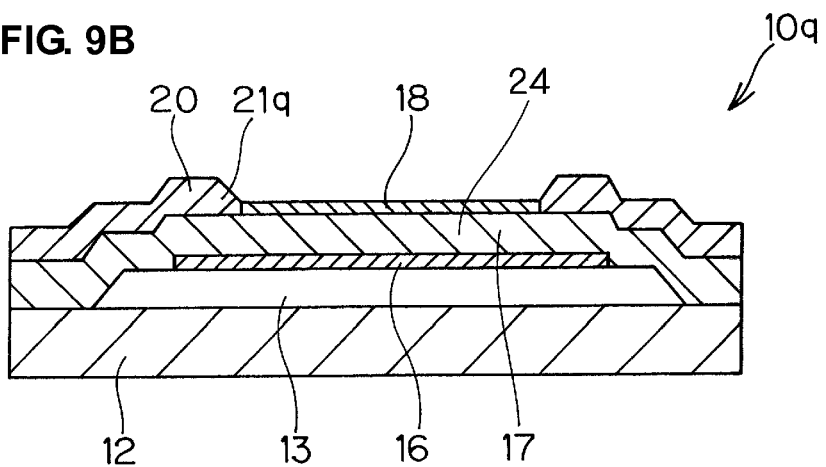

In a piezoelectric resonator 10q shown in FIG. 9B, an end portion 21q having a tapered shape in cross section which is included in a heat-radiating film 20 is in contact with an upper electrode 18 so that the heat-radiating film 20 is in contact with a vibration section when transparently viewed from a film-thickness direction.

Figure 9C:
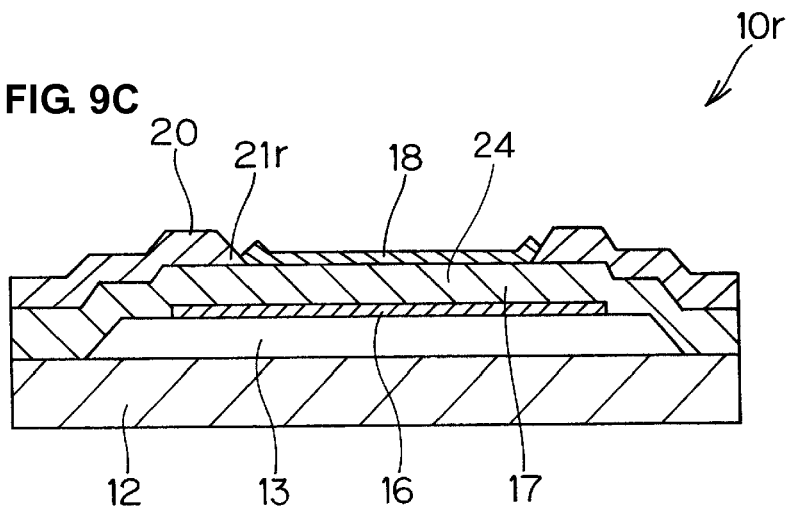

In a piezoelectric resonator 10r shown in FIG. 9C, an upper electrode 18 overlaps an end portion 21r having a tapered shape in cross section which is included in a heat-radiating film 20 so that the heat-radiating film 20 is overlapped by a portion inside a periphery of a vibration section when transparently viewed from a film-thickness direction.

Since an acoustic characteristic is gradually changed in the end portion of the vibration section due to the taper provided in each of the edge portions 21p, 21q, and 21r of the respective heat-radiating films 20, a range of allowable displacement of the heat-radiating films 20 which suppress spurious responses is increased, and accordingly, manufacturing tolerances can be increased. For example, in a taper angle of about 90 degrees (i.e., substantially vertical), when a width X of an overlapping region (refer to FIG. 9A) satisfies X≦0.5 µm, the spurious response is sufficiently suppressed. In a taper angle of about 45 degrees, when the width X satisfies X<1.0 µm, the spurious response is sufficiently suppressed. That is, as the taper angle is decreased, the range of allowable displacement is increased.

Fourth Preferred Embodiment

Figure 11:
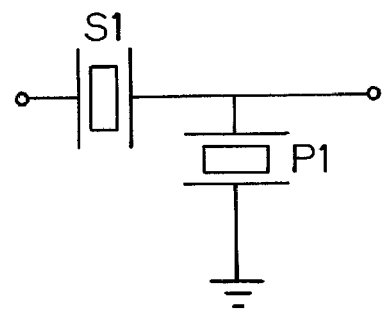
FIG. 11 is a circuit diagram illustrating the piezoelectric filter according to the fourth preferred embodiment of the present invention.

A piezoelectric filter according to a fourth preferred embodiment of the present invention will be described with reference to FIGS. 10 and 11.

As shown in FIG. 10, a piezoelectric filter 10k is configured such that a plurality of piezoelectric resonators S1 and P1 are arranged on a single substrate 12. That is, a plurality of vibration sections 24s and 24t are provided on a second thin-film portion which is isolated from the substrate 12 with a gap 13 interposed therebetween. The vibration section 24s is configured such that a piezoelectric film 17k is sandwiched between electrodes 16s and 18s, and the vibration section 24t is configured such that the piezoelectric film 17k is sandwiched between electrodes 16t and 18t. The piezoelectric filter 10k, as shown as a circuit diagram in FIG. 11, has a basic L-shape and a one-step configuration including a piezoelectric resonator S1 connected in series and a piezoelectric resonator P1 connected in parallel, and such basic configurations are connected to one another in several steps in a cascade manner.

A film configuration of an example of a method of manufacturing the piezoelectric filter 10k is shown in Table 4 below.

TABLE 4

Film Configuration of Resonator, Resonant Frequency, and Area for 1 pF

| Film Thickness (nm) | Series Resonator (S1) | Parallel Resonator (P1) |
|---|---|---|
| Step Forming Film SiO$_2$ | 100 nm | 100 nm |
| Amount of Step Etching | 20 nm | 20 nm |
| Heat-Radiating Film AlN | 680 | 680 |
| Upper Electrode (Ti/Pt/Au/Pt/Ti) | 10/10/60/30/10 | 10/10/60/30/10 |
| Piezoelectric Film AlN | 1580 | 1580 |
| Lower Electrode (Ti/Pt/Au/Pt/Ti) | 10/30/60/10/10 | 10/50/60/10/10 |
| Supporting Film SiO$_2$ | 100 | 100 |
| Resonant Frequency | 1880 | 1822 |
| Area for Capacitance of 1 pH (μm$^2$) | 18000 | 18000 |

In the piezoelectric filter 10k of the fourth preferred embodiment, a ripple is suppressed and heat generation caused by an increased loss is suppressed, and accordingly, excellent electric-power resistance is obtained. Furthermore, a heat-radiating path is enlarged, and heat generated in the vibration sections is effectively radiated to a supporting portion, and accordingly, excellent electric-power resistance is obtained.

When the piezoelectric film AlN of Table 4 is to be formed, as with the piezoelectric resonator of the first preferred embodiment, the piezoelectric film 17k is formed and a surface of the piezoelectric film 17k is subjected to flattening processing. Thereafter, a piezoelectric film of the parallel resonator P1 having a low resonant frequency is covered by a resist, and then, a surface of a piezoelectric film of the series resonator S1 having a high resonant frequency is subjected to flattening processing.

Fifth Preferred Embodiment

A configuration of a piezoelectric filter according to a fifth preferred embodiment of the present invention is substantially the same as that of the piezoelectric filter of the fourth preferred embodiment except for a film configuration. The film configuration of the fifth preferred embodiment is shown in Table 5 below.

TABLE 5

Film Configuration of Resonator, Resonant Frequency, and Area for 1 pF

| Film Thickness (nm) | Series Resonator (S1) | Parallel Resonator (P1) |
|---|---|---|
| Step Forming Film SiO$_2$ | 100 nm | 100 nm |
| Amount of Step Etching | 20 nm | 20 nm |
| Heat-Radiating Film AlN | 900 | 900 |
| Upper Electrode (Ti/Pt/Au/Pt/Ti) | 10/10/80/70/10 | 10/10/80/70/10 |
| Piezoelectric Film AlN | 1135 | 1135 |
| Lower Electrode (Ti/Pt/Au/Pt/Ti) | 10/70/80/10/10 | 10/95/80/10/10 |
| Supporting Film SiO$_2$ | 100 | 100 |
| Resonant Frequency | 1880 | 1822 |
| Area for Capacitance of 1 pH (μm$^2$) | 13000 | 13000 |

In the piezoelectric filter of the fifth preferred embodiment, areas required to arrange the resonators having capacitances of about 1 pF are reduced by about 27% as compared to the configuration of the fourth preferred embodiment. Therefore, the fifth preferred embodiment achieves miniaturization of a device. Furthermore, since only small areas are required for respective vibration sections, a distance through which heat generated in the approximate center of each of the vibration sections is transmitted to a heat-radiating film unit is reduced. Accordingly, an excellent heat-radiating property and an excellent electric-power resistance are obtained.

Sixth Preferred Embodiment

A piezoelectric filter according to a sixth preferred embodiment of the present invention will be described with reference to FIGS. 12 and 13.

Figure 12:
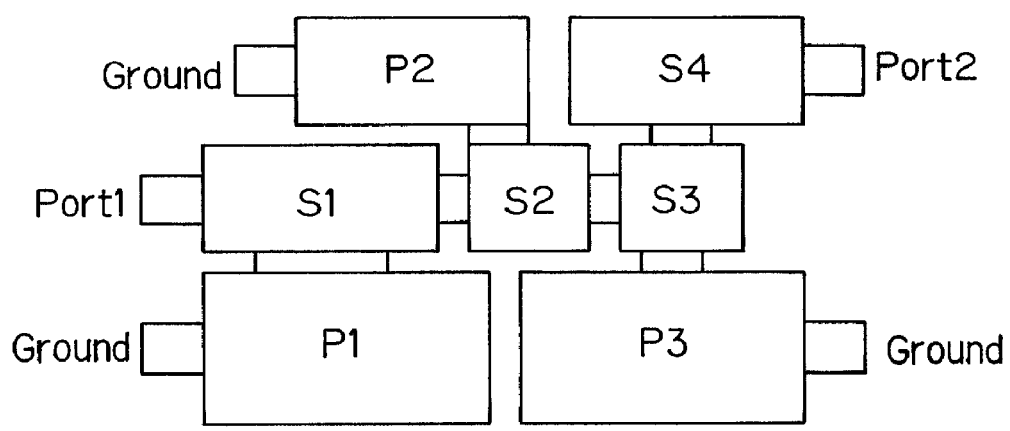
FIG. 12 is a diagram of a layout of a piezoelectric filter according to a sixth preferred embodiment of the present invention.
Figure 13:
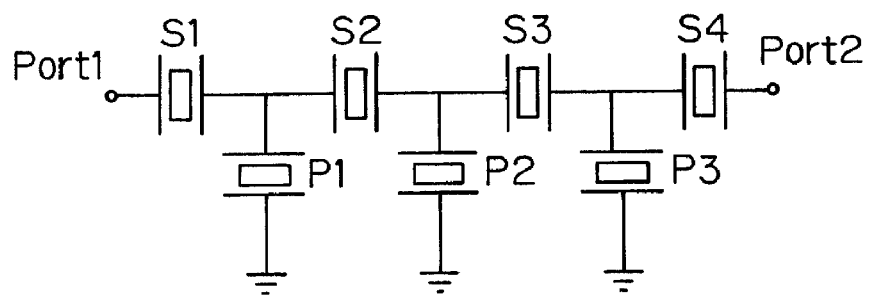
FIG. 13 is a circuit diagram illustrating the piezoelectric filter according to the sixth preferred embodiment of the present invention.

As shown in FIG. 12, the piezoelectric filter of the sixth preferred embodiment is configured such that piezoelectric resonators P1 to P3 are connected in parallel to piezoelectric resonators S1 to S4 which are connected to one another in series. In the piezoelectric filter, the piezoelectric resonators S1 to S4 and P1 to P3 are preferably arranged as shown in FIG. 13 which is a top plan view.

Film configurations of the resonators S1 to S4 and P1 to P3 in an example of a method for manufacturing the piezoelectric filter of the sixth preferred embodiment are shown in Table 6 below.

TABLE 6

Film Configuration of Resonator, Resonant Frequency, and Area for 1 pF

| Film Thickness (nm) | Series Resonators (S1, S2, S3, S4) | Parallel Resonators (P1, P2, P3) |
|---|---|---|
| Step Forming Film SiO$_2$ | 100 nm | 100 nm |
| Amount of Step Etching | 20 nm | 20 nm |
| Heat-Radiating Film AlN | 680 | 680 |
| Upper Electrode (Ti/Pt/Au/Pt/Ti) | 10/10/60/30/10 | 10/10/60/30/10 |
| Piezoelectric Film AlN | 1580 | 1580 |
| Lower Electrode (Ti/Pt/Au/Pt/Ti) | 10/30/60/10/10 | 10/50/60/10/10 |
| Supporting Film SiO$_2$ | 100 | 100 |
| Resonant Frequency | 1880 | 1822 |
| Area for Capacitance of 1 pH (μm$^2$) | 18000 | 18000 |

Characteristic values of the resonators S1 to S4 and P1 to P3 are shown in Table 7 below.

TABLE 7

Characteristic Values of Resonators of Filter

| | S1 | S2 | S3 | S4 | P1 | P2 | P3 |
|---|---|---|---|---|---|---|---|
| capacitance (pF) | 1.7 | 1.1 | 1.1 | 1.7 | 2.2 | 1.7 | 2.2 |
| Δf (MHz) | 57 | 56 | 56 | 57 | 55 | 55 | 55 |
| area (μm$^2$) | 30300 | 19600 | 19600 | 30300 | 39300 | 30300 | 39300 |

Tables 6 and 7 show an example of a method for manufacturing a Tx filter for a US-PCS band (pass band: 1850 MHz to 1910 MHz).

Any of the first to fifth preferred embodiments may be used for cross-sectional configurations of the piezoelectric resonators and the piezoelectric filter. Furthermore, the film configurations of the piezoelectric resonators as shown in the fifth preferred embodiment (Table 5) may preferably be used.

The vibration sections of the resonators are preferably substantially rectangular-shaped when viewed through in a film-thickness direction. The shapes of the vibration sections of the resonators transparently viewed in a film-thickness direction may be defined by a combination of rectangles, or rectangles each of which has a ratio of a short side to a long side of about 2 or less, and particularly, rectangles each of which has substantially a golden ratio of a short side to a long side (that is, rectangles each of which has a ratio of a short side to a long side of about 1:1.6). With this configuration, an unnecessary region is eliminated in the layout shown in FIG. 13, and accordingly, an overall area of the filter is reduced.

Note that the golden ratio is the best ratio and an approximate value thereof is 1:1.618. That is, the golden ratio is a ratio a:b obtained when a line segment is divided into two portions having a length of a and a length of b so that an expression a:b=b:(a+b) is satisfied.

Seventh Preferred Embodiment

A piezoelectric resonator according to a seventh preferred embodiment of the present invention will be described with reference to FIGS. 14A to 14C.

Figure 14A:
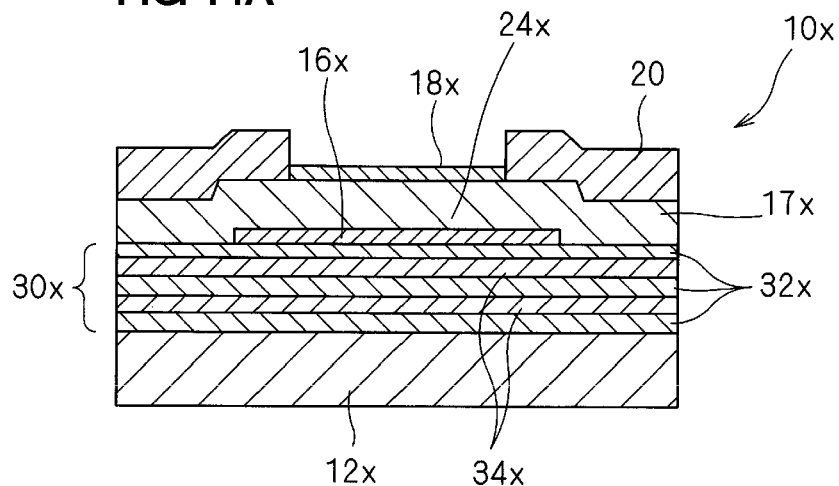
FIGS. 14A to 14C are sectional views illustrating a piezoelectric resonator according to a seventh preferred embodiment of the present invention.

As with the piezoelectric resonator of the first preferred embodiment, a piezoelectric resonator 10x shown in FIG. 14A includes a vibration section 24x in which a piezoelectric thin film 17x is sandwiched between electrodes 16x and 18x, and a heat-radiating film 20 which is in contact with a periphery of an upper electrode 18x which defines a periphery of the vibration section 24x when viewed through in a film-thickness direction. Note that the heat-radiating film 20 may extend outside the periphery of the upper electrode 18x and overlap a portion in the vicinity of the periphery of the upper electrode 18x which defines the periphery of the vibration section 24x when viewed through in a film-thickness direction.

Unlike the piezoelectric resonator of the first preferred embodiment, an acoustic reflection film 30x, which includes low-acoustic impedance films 32x which preferably have thicknesses of about λ/4, for example, and high-acoustic impedance films 34x which preferably have thicknesses of about λ/4, for example, that are alternately laminated, is arranged between the vibration section 24x and a substrate 12x. The value λ (m) is determined using a sound velocity (m/s) of the material and an operation frequency f(Hz) of a resonator by the following equation: λ=v/f. Vibration of the vibration section 24x is reflected by the acoustic reflection film 30x and is not transmitted to the substrate 12x. That is, the substrate 12x and the vibration section 24x are acoustically isolated from each other by the acoustic reflection film 30x.

The low-acoustic impedance films 32x are preferably made of $SiO_2$, SiOC, polyimide, or Al, for example, and the high-acoustic impedance films 34x are preferably made of $Ta_2O_5$, diamond, DLC (Diamond-Like-Carbon), Si, SiN, AlN, Au, Pt, Ru, W, or Mo, for example.

Although not shown, the acoustic reflection film 30x is not arranged in a portion spaced away from the vibration section 24x in the piezoelectric resonator 10x. Therefore, a thin-film section including the piezoelectric film 17 which is arranged over the acoustic reflection film 30x is directly supported by the substrate 24x without the acoustic reflection film 30x at portions spaced away from the vibration section 24x.

Figure 14B:
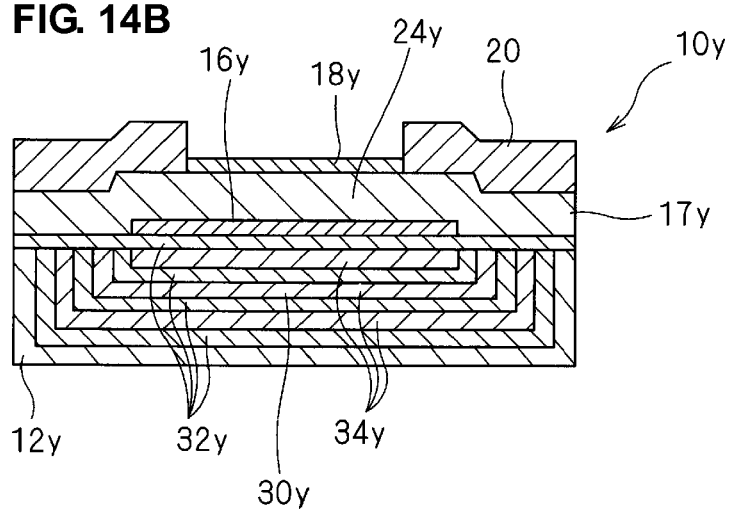
Figure 14C:
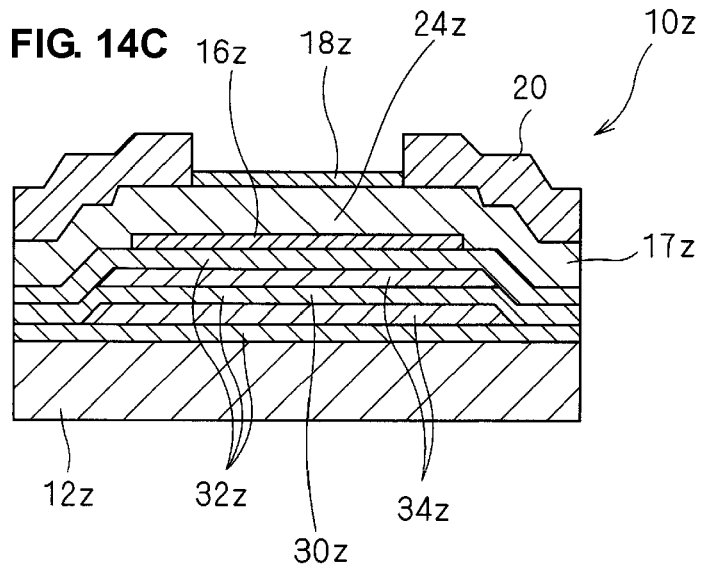

Note that, as can be seen from a piezoelectric resonator 10y shown in FIG. 14B and a piezoelectric resonator 10z shown in FIG. 14C, a piezoelectric resonator may preferably be configured such that a thin-film section is supported by a substrate 12y through extending portions of some of the low-acoustic impedance films 32y and the high-acoustic impedance films 34y which are included in an acoustic reflection film 30y at a portion spaced away from a vibration portion 24y including a piezoelectric thin film 17y which is sandwiched between electrodes 16y and 18y, or may be configured such that a thin-film section is supported by a substrate 12z through extending portions of some of the low-acoustic impedance films 32z and the high-acoustic impedance films 34z which are included in an acoustic reflection film 30z at a portion spaced away from a vibration portion 24z including a piezoelectric thin film 17z which is sandwiched between electrodes 16z and 18z.

In the piezoelectric resonators 10x, 10y, and 10z, since gaps are not provided between the vibration section 24x and substrate 12x, between the vibration section 24y and substrate 12y, and between the vibration section 24z and substrate 12z, excellent mechanical strength and excellent heat-radiating property are obtained.

Eighth Preferred Embodiment

Figure 15:
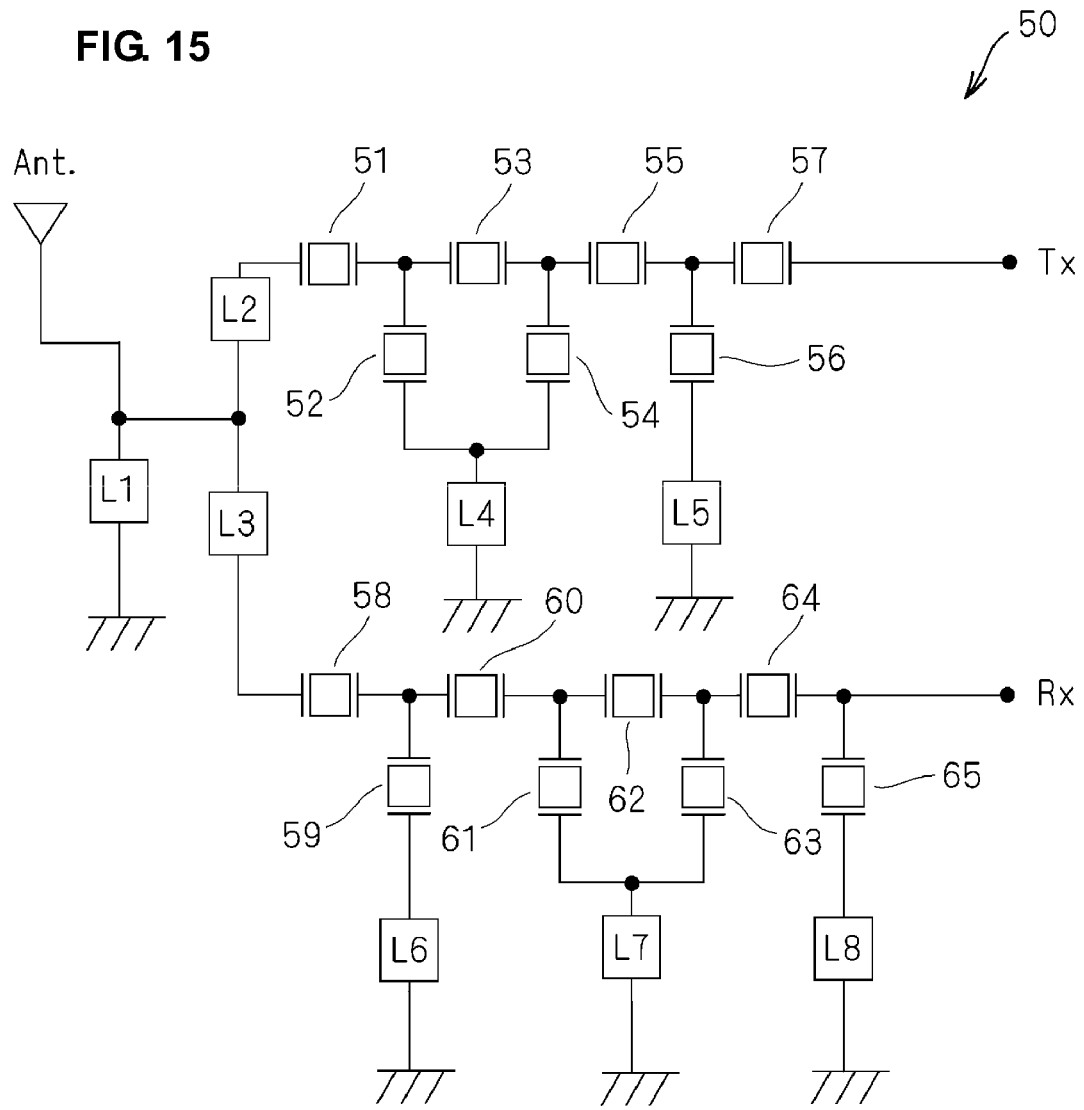
FIG. 15 is a circuit diagram illustrating a piezoelectric resonator according to an eighth preferred embodiment of the present invention.

As shown in FIG. 15, a DPX (branching filter) 50 according to an eighth preferred embodiment of the present invention includes piezoelectric filters including piezoelectric resonators 51 to 65 which correspond to any of the piezoelectric resonators and the piezoelectric filters according to the first to seventh preferred embodiments, and further includes inductors L1 to L8. BAW resonators corresponding to any of the resonators described in the first to seventh preferred embodiments may preferably be used as the resonators 51 to 65, and SAW resonators or elastic boundary wave resonators may be partially used.

The DPX 50 shown in FIG. 15 is configured such that unbalanced signals are input to and output from a Tx terminal and an Rx terminal. However, when filters, such as longitudinally-coupled SAW filters, longitudinally-coupled BAW filters, or elastic boundary wave filters, for example, which have a function of converting unbalanced signals into balanced signals are used, the Rx terminal can output balanced signals.

Ninth Preferred Embodiment

Figure 16:
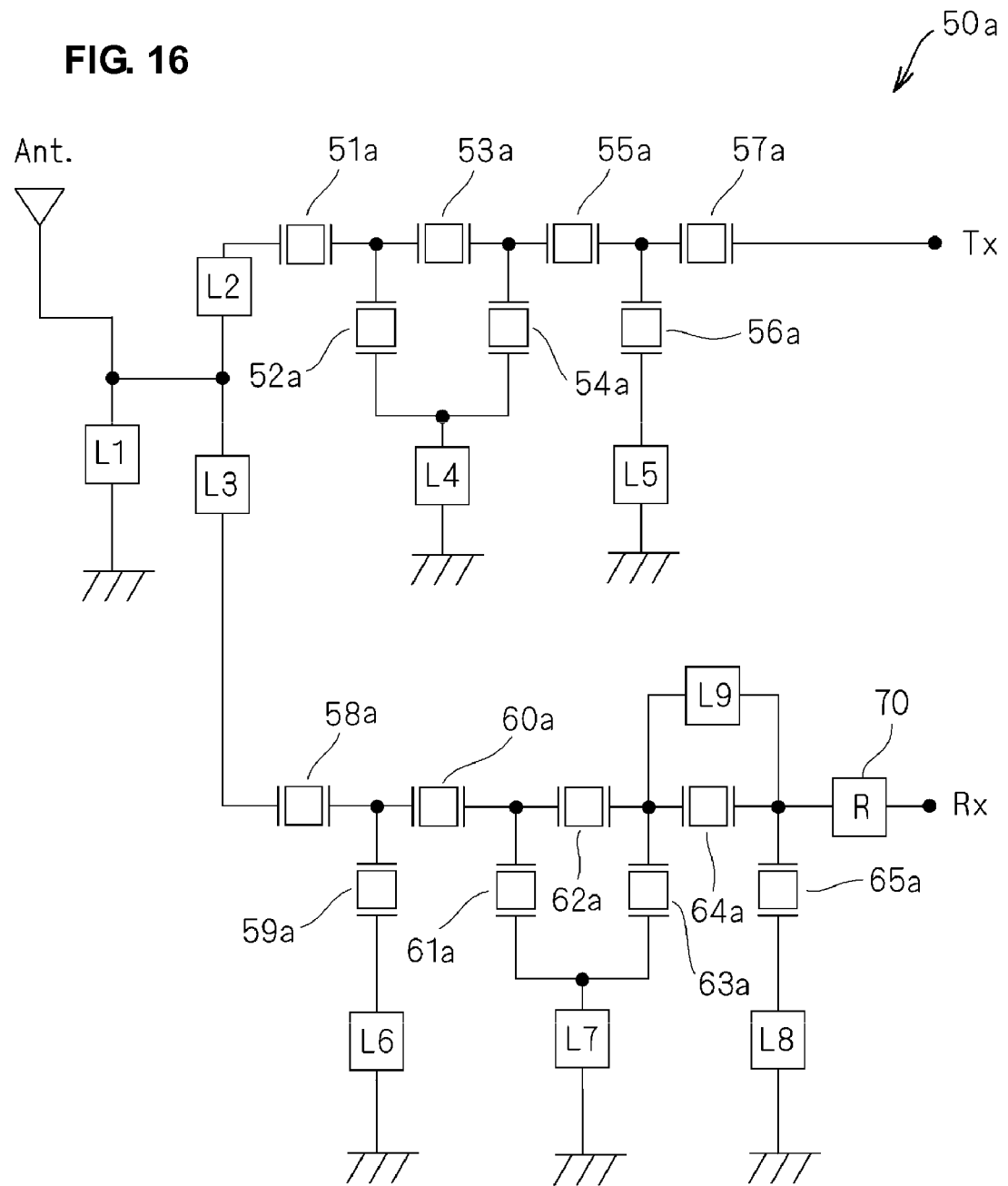
FIG. 16 is a circuit diagram illustrating a piezoelectric resonator according to a ninth preferred embodiment of the present invention.
Figure 17:
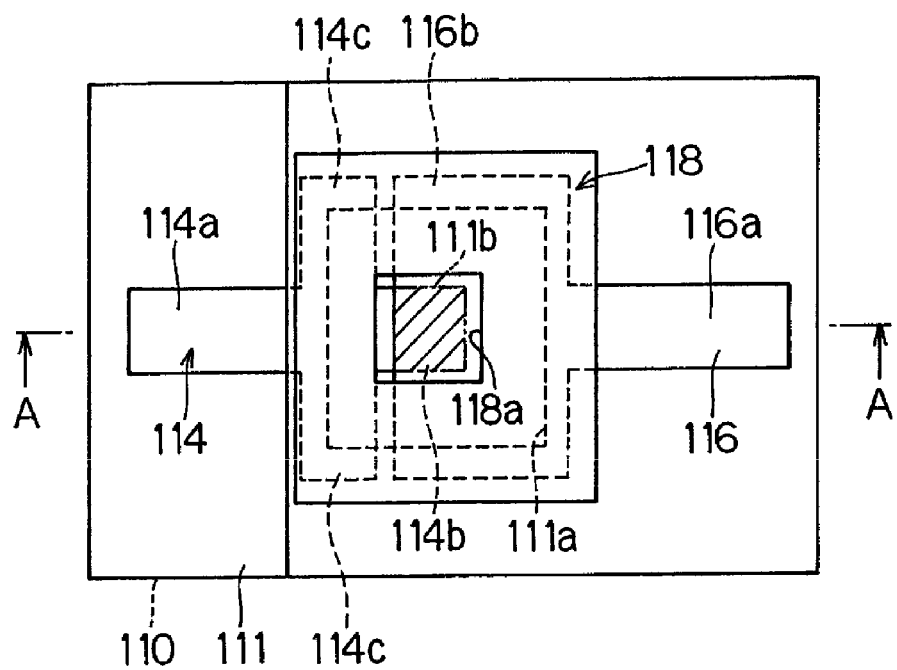
FIG. 17 is a plan view illustrating a piezoelectric resonator according to the related art.
Figure 18:
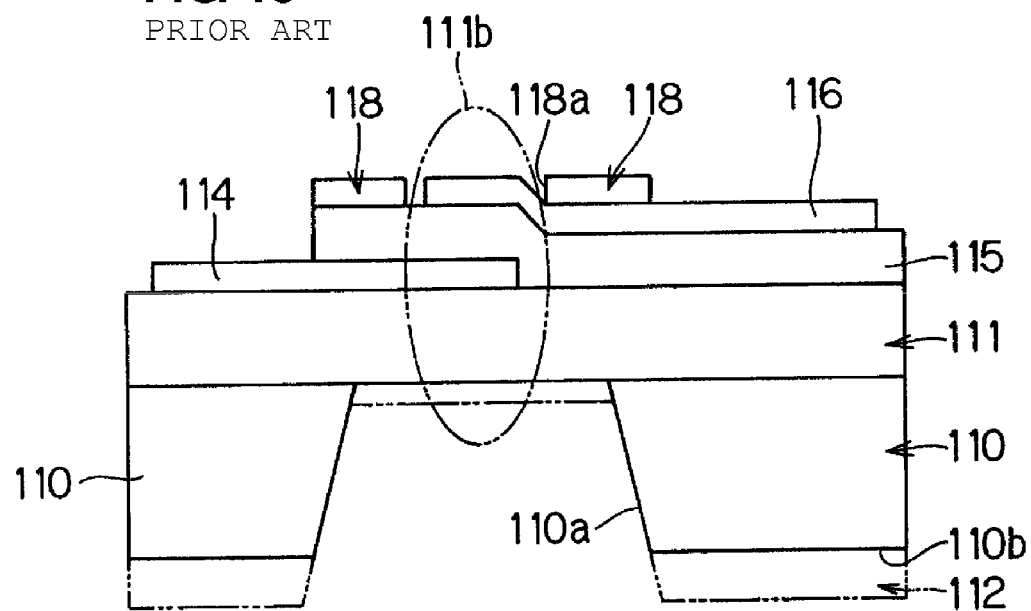
FIG. 18 is a sectional view illustrating the piezoelectric resonator according to the related art.

As shown in FIG. 16, a DPX (branching filter) 50a according to a ninth preferred embodiment of the present invention includes piezoelectric filters including piezoelectric resonators 51a to 65a which correspond to any of the piezoelectric resonators and the piezoelectric filters according to the first to seventh preferred embodiments, and further includes inductors L1 to L9 and a resistor 70.

In the DPX 50a of the ninth preferred embodiment, the inductor L9 is connected in parallel to the resonator 64a included in an Rx filter. The resonators 58, 60, and 62 included in the Rx filter are serial resonators having substantially identical operation frequencies. The resonators 59, 61, 63, and 65 are parallel resonators having operation frequencies lower than those of the series resonators. An operation frequency of the series resonator 64 is preferably lower than those of the other serial resonators 58, 60, and 62 and higher than those of the parallel resonators 59, 61, 63, and 65. With this configuration, a filter having a wide pass band is provided using resonators having a small fractional bandwidth.

As described above, since the heat-radiating film which extends from the periphery of the vibration section to the first thin-film section is arranged so that the heat-radiating film is in contact with or overlaps a portion corresponding to the periphery of the vibration section of the electrodes, the heat-radiating property is improved and the heat generation caused by unnecessary vibration is suppressed.

Note that the present invention is not limited to the foregoing preferred embodiments and various modifications may be made.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric resonator comprising:
a substrate; and
a thin-film section including a first thin-film section supported by the substrate and a second thin-film section acoustically isolated from the substrate, the second thin-film section including a piezoelectric thin film in which first and second electrodes are disposed on respective main surfaces thereof so that a vibration section is defined by a portion in which the first and second electrodes overlap each other in the second thin-film section when viewed through in a film-thickness direction; wherein
the thin-film section further includes a heat-radiating film which is in contact with a peripheral edge of at least one of the first and second electrodes defining portions of a periphery of the vibration section, and which extends from the peripheral edge of the at least one of the first and second electrodes to the first thin-film section when viewed through in a film-thickness direction; and
the heat-radiating film is made of a different material than the first and second electrodes.

2. The piezoelectric resonator according to claim 1, wherein the thin-film section further includes a step-forming film having a step portion disposed inside of the thin-film section with an interval between the step portion and the periphery of the vibration section when viewed through in the film-thickness direction.

3. The piezoelectric resonator according to claim 1, wherein a film thickness of the first electrode included in the vibration section and a film thickness of the second electrode included in the vibration section are different from each other.

4. The piezoelectric resonator according to claim 3, wherein the film thickness of the first electrode included in the vibration section is relatively small and the film thickness of the second electrode included in the vibration section is relatively large.

5. A piezoelectric filter comprising:
a plurality of piezoelectric resonators as set forth in claim 1 disposed on the substrate including respective vibration sections; wherein
the first and second electrodes which define the vibration sections are electrically connected to each other so as to define a filter circuit.

6. The piezoelectric filter according to claim 5, wherein each of the vibration sections has one of a substantially square shape or a substantially rectangular shape having a ratio of a long side to a short side is about 2 or less when viewed through in the film-thickness direction.

7. The piezoelectric filter according to claim 5, wherein each of the vibration sections has one of a substantially square shape or a substantially rectangular shape having approximately a golden ratio of a long side to a short side when viewed through in the film-thickness direction.

8. A piezoelectric resonator comprising:
a substrate; and
a thin-film section including a first thin-film section supported by the substrate and a second thin-film section acoustically isolated from the substrate, the second thin-film section including a piezoelectric thin film in which first and second electrodes are disposed on respective main surfaces thereof so that a vibration section is defined by a portion in which the first and second electrodes overlap each other in the second thin-film section when viewed through in a film-thickness direction; wherein
the thin-film section further includes a heat-radiating film which overlaps a peripheral edge of at least one of the first and second electrodes defining portions of a periphery of the vibration section, and which extends from a portion inside the vibration section relative to the periphery of the vibration section to the first thin-film section when viewed through in a film-thickness direction; and
the heat-radiating film is made of a different material than the first and second electrodes.

9. The piezoelectric resonator according to claim 8, wherein, in a vicinity of a peripheral edge of the heat-radiating film arranged inside the periphery of the vibration section when viewed through in a film-thickness direction, thicknesses of portions of the heat-radiating film increase as the portions are located farther from the peripheral edge.

10. The piezoelectric resonator according to claim 8, wherein the thin-film section further includes a step-forming film having a step portion disposed inside of the thin-film section with an interval between the step portion and the periphery of the vibration section when viewed through in the film-thickness direction.

11. The piezoelectric resonator according to claim 8, wherein a film thickness of the first electrode included in the vibration section and a film thickness of the second electrode included in the vibration section are different from each other.

12. The piezoelectric resonator according to claim 11, wherein the film thickness of the first electrode included in the vibration section is relatively small and the film thickness of the second electrode included in the vibration section is relatively large.

13. A piezoelectric filter comprising:
a plurality of piezoelectric resonators as set forth in claim 8 disposed on the substrate including respective vibration sections; wherein
the first and second electrodes which define the vibration sections are electrically connected to each other so as to define a filter circuit.

14. The piezoelectric filter according to claim 13, wherein each of the vibration sections has one of a substantially square shape or a substantially rectangular shape having a ratio of a long side to a short side is about 2 or less when viewed through in the film-thickness direction.

15. The piezoelectric filter according to claim 13, wherein each of the vibration sections has one of a substantially square shape or a substantially rectangular shape having approximately a golden ratio of a long side to a short side when viewed through in the film-thickness direction.

* * * * *